(12) United States Patent
Dally (10) Patent No.: US 9,460,776 B2
(45) Date of Patent: Oct. 4, 2016

(54) SRAM VOLTAGE ASSIST

(71) Applicant: NVIDIA Corporation, Santa Clara, CA (US)

(72) Inventor: William James Dally, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 594 days.

(21) Appl. No.: 13/748,499

(22) Filed: Jan. 23, 2013

(65) Prior Publication Data

US 2014/0204657 A1    Jul. 24, 2014

(51) Int. Cl.
| | | |
|---|---|---|
| G11C 11/24 | (2006.01) | |
| G11C 11/412 | (2006.01) | |
| G11C 11/419 | (2006.01) | |
| G11C 11/404 | (2006.01) | |

(52) U.S. Cl.
CPC .......... *G11C 11/4125* (2013.01); *G11C 11/419* (2013.01); *G11C 11/404* (2013.01)

(58) Field of Classification Search
CPC ....... G11C 11/413; G11C 8/08; G11C 5/145; G11C 7/12; G11C 11/418; G11C 11/419; G11C 11/4074
See application file for complete search history.

(56) References Cited

U.S. PATENT DOCUMENTS

| | | | |
|---|---|---|---|
| 6,160,745 A | 12/2000 | Hashimoto | |
| 7,924,633 B2 | 4/2011 | Behrends et al. | |
| 9,208,900 B2 | 12/2015 | Sinangil et al. | |
| 2010/0207924 A1* | 8/2010 | Saito | 345/211 |
| 2011/0063932 A1* | 3/2011 | Chandra | G11C 11/413 365/194 |
| 2011/0158029 A1* | 6/2011 | Sasaki | G11C 8/08 365/230.06 |
| 2012/0106237 A1* | 5/2012 | Dengler et al. | 365/154 |
| 2012/0140551 A1* | 6/2012 | Arsovski | G11C 7/12 365/154 |

FOREIGN PATENT DOCUMENTS

| | | |
|---|---|---|
| CN | 101149965 A | 3/2008 |
| CN | 101807378 A | 8/2010 |
| JP | 2011138570 A | 7/2011 |
| TW | 201124995 A | 7/2011 |

OTHER PUBLICATIONS

Office Action from Taiwan Patent Application No. 102141085, dated May 18, 2015.
Non-Final Office Action from U.S. Appl. No. 14/147,411, dated Mar. 11, 2015.

(Continued)

*Primary Examiner* — Son Dinh
*Assistant Examiner* — Uyen B Tran
(74) *Attorney, Agent, or Firm* — Zilka-Kotab, PC (57) ABSTRACT

The disclosure provides for an SRAM array having a plurality of wordlines and a plurality of bitlines, referred to generally as SRAM lines. The array has a plurality of cells, each cell being defined by an intersection between one of the wordlines and one of the bitlines. The SRAM array further includes voltage boost circuitry operatively coupled with the cells, the voltage boost circuitry being configured to provide an amount of voltage boost that is based on an address of a cell to be accessed and/or to provide this voltage boost on an SRAM line via capacitive charge coupling.

18 Claims, 4 Drawing Sheets

(56) References Cited

OTHER PUBLICATIONS

Karl et al., "A 4.6ghz 162Mb SRAM Design in 22nm Tri-Gate CMOS Technology with Integrated Active VMIN-Enhancing Assist Circuitry," 2012 IEEE Solid-State Circuits Conference, ISSCC 2012, Session 13, High-Performance Embedded Sram, 13.1, pp. 230-231 and continuation page.
Yabuuchi et al., "A 45nm 0.6V Cross-Point 8T SRAM with Negative Biased Read/Write Assist," 2009 Symposium on VLSI Circuits Digest of Technical Papers, 2009, pp. 158-159.
Office Action from Taiwan Patent Application No. 103101970, dated Aug. 4, 2015.
Notice of Allowance from U.S. Appl. No. 14/147,411, dated Aug. 4, 2015.
Office Action from German Patent Application No. 102013114243.5, dated Oct. 13, 2015.
Office Action from Chinese Patent Application No. 201410033451.5, dated May 23, 2016.
Office Action from Chinese Patent Application No. 201310753289.X, dated Apr. 25, 2016.
Office Action from German Patent Application No. 10 2014 100 677.1, dated Jan. 26, 2016.

* cited by examiner

SRAM VOLTAGE ASSIST

BACKGROUND

Static random access memory (SRAM) arrays are sometimes designed to include voltage assist circuitry to improve performance. Specifically, voltage assist can improve the ability to read from and write to SRAM cells, and can prevent stored values from being inadvertently flipped during read and write operations. Existing assist mechanisms are typically designed for worst case scenarios, to account for a wide range of operating conditions and fabrication variations. This can result in the assist circuitry being relatively large and consuming a significant amount of power.

DETAILED DESCRIPTION

As technology has progressed, SRAM devices have become smaller and operating voltages have decreased, providing power savings and improvements in performance. However, as these parameters are reduced, the variability intrinsic in fabrication tolerances and operating conditions have a greater potential to negatively affect performance of the devices. In particular, these improvements allow storage of memory states with lower levels of charge. This, however, can increase the likelihood that the device will be affected adversely by noise sources (e.g., ambient electromagnetic noise, noise radiated by other system components, power supply noise, etc.), by leakage current(s), etc. Specific design challenges include ensuring the ability to reliably read from and write to cells, and to avoid inadvertent corruption of memory states during read and write operations.

Voltage assist can be used to address these challenges and ensure successful operation in the face of decreasing voltages and physical dimensions. For example, various signals, nodes, etc. can be boosted beyond a range bounded by the positive and negative supplies used to otherwise operate the memory storage cells. As used herein, the term "voltage boost" and the like will be used to refer to any voltage outside the voltage supply range of a memory cell, and may therefore denote, for example, increasing a signal/node to a level above a positive supply or to a level below a negative supply.

One prior assist method is to continuously provide a single boosted voltage level to all of the wordlines and bitlines of the SRAM array, for example with a charge pump or other auxiliary supply. The boosted voltage level is selected at design time to account for variations in performance and behavior from cell to cell, for example as a result of device variations occurring during fabrication. The level also must take into account all of the potential operating conditions and modes. This necessarily entails increased energy use, and that assist will at times be applied when it is not needed, or at a level beyond or different than that needed for a particular wordline, bitline or cell. Furthermore, charge pumps and the like can be relatively large in size (e.g., due to one or more large capacitors), which can negatively impact size, cost, weight, etc., of the device.

The present discussion provides for novel and improved methods for providing voltage boost. In one embodiment, voltage boost is selectively produced and applied dynamically at a level based on the particular memory cell(s) being accessed, i.e., based on the address of the cell. In addition to address-based voltage boost, boost can be generated by capacitively coupling charge onto wordlines and bitlines, thus eliminating the need for an auxiliary supply and its associated disadvantages.

Figure 1A:
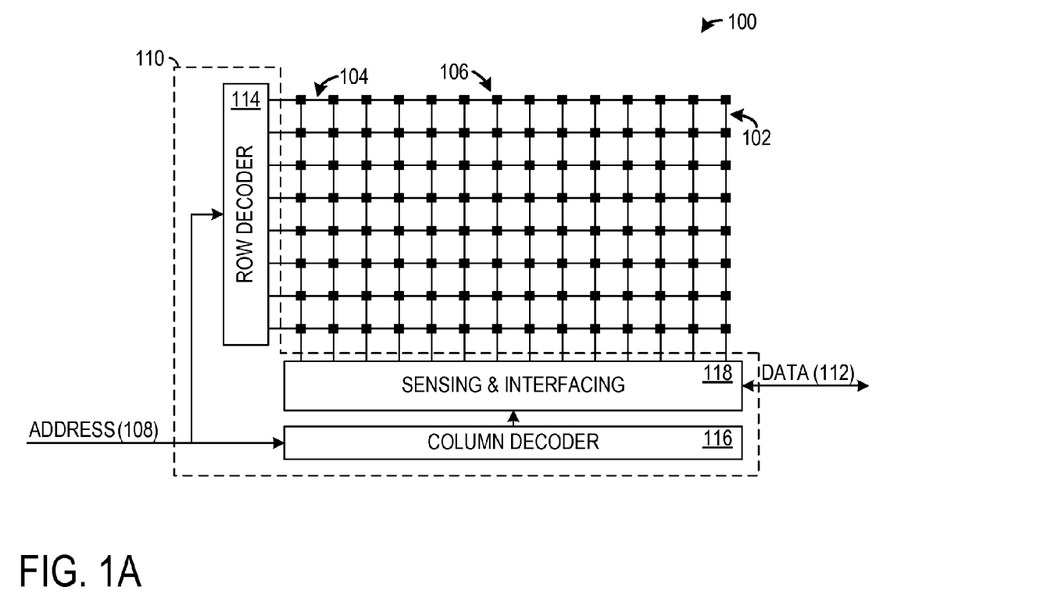
FIG. 1A schematically shows an example SRAM array that may be provided with embodiments of voltage boost mechanisms described herein.

Before discussing the specific boost mechanisms, an exemplary SRAM array and cell with which they may be used will be described with reference to FIGS. 1A and 1B. FIG. 1A schematically depicts an example of an SRAM array 100 that can be implemented with the boost systems and methods described herein. Array 100 includes bitlines 102 and wordlines 104, referred to generically as SRAM lines, used to access SRAM cells 106. Each cell 106 is defined at the intersection between one or more bitlines 102 and one or more wordlines 104. In typical configurations, each SRAM cell 106 is defined at the intersection of a single wordline 104 and a pair of bitlines 102, with each row of SRAM cells 106 coupled to a common wordline 104 and each column of SRAM cells 106 coupled to a common pair of bitlines 102, though other configurations are possible.

In order to interact with the memory, a cooperating unit (e.g., CPU, GPU, etc.), provides an address 108 for a particular SRAM cell 106, which is received and used by peripheral circuitry 110 to either read or write data 112 to the addressed SRAM cell(s). Circuitry 110 may include, for example, row decoder 114 and column decoder 116 configured to receive address 108 and thereby initiate operations to access the SRAM cell(s) identified by the address. Once the desired cell(s) have been selected, data 112 is either retrieved (read) from the addressed SRAM cell via sensing and interfacing logic 118 or provided (written) to the addressed SRAM cell via logic 118. It will be appreciated that the components illustrated in FIG. 1A are provided for the ease of understanding, and typical memory devices may include additional and/or different components in some implementations.

Figure 1B:
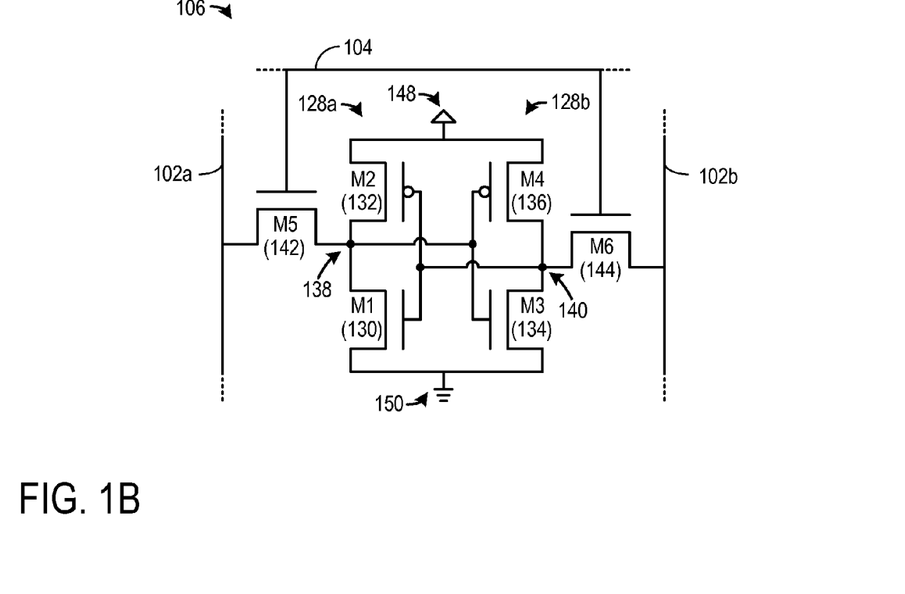
FIG. 1B schematically shows an SRAM cell of the SRAM array of FIG. 1A.

Turning now to FIG. 1B, a single SRAM cell 106 of FIG. 1A is schematically shown at the transistor level. Specifically, SRAM cell 106 is illustrated as a six transistor "6T" cell, though the present discussion of voltage boosting is applicable to other SRAM configurations. For example it can be applied to an eight transistor "8T" cell. SRAM cell 106 includes a pair of cross-coupled inverters 128 for storing a single memory bit. First inverter 128a includes transistors 130 and 132; second inverter 128b includes transistors 134 and 136. The inverters cooperate to store complimentary states at storage nodes 138 and 140, with each inverter 128 reinforcing operation of the other via positive feedback. For example, if SRAM cell 106 were storing logic 1. node 138 is held at logic 1 with node 140 at logic 0.

A read of a cell 106 may proceed as follows. First, bitlines 102a and 102b are "precharged" to the positive supply voltage 148 (e.g., $V_{DD}$). Wordline 104 is then asserted to enable access transistors 142 and 144, which respectively couples nodes 138 and 140 to bitlines 102a and 102b. Assuming node 140 is held at the negative supply (logic 0) by inverter 128b (i.e., via conduction of transistor 134) and the bitlines are no longer being actively driven, bitline 102b is discharged through transistors 134 and 144. As bitline 102b is discharged, a differential voltage is observed between bitlines 102a and 102b, since bitline 102a may remain substantially near the supply voltage due to the intrinsic capacitance of bitline 102a. This voltage differential is detectable, for example, via a differential sense amplifier coupled to the pair of bitlines 102a and 102b, and data 112 in the form of a binary digital value is provided based on the voltage differential (e.g., via sensing and interfacing logic 116).

A write of SRAM cell 106 may proceed as follows. First, one of the bitlines (e.g., bitline 102a) is driven to a desired value to be stored via driving circuitry (e.g., via circuitry 110), and bitline 102b is driven with the complimentary value. For the purpose of this example, the desired value is a logic 1, corresponding to positive supply voltage 148, and bitline 102a is therefore driven to the positive supply voltage while bitline 102b is driven to negative supply voltage 150. Once the bitlines are appropriately driven, wordline 104 is asserted in order to couple SRAM cell 106 to bitlines 102. Once the access transistor is coupled, the side pulling down overpowers its inverter, thereby writing the desired value into the SRAM cell.

From the above, it will be appreciated that reliable read operation can depend upon the ability of the SRAM cell (e.g., via NMOS transistors 130 and/or 134) to drive one of the precharged bitlines toward negative supply voltage 150 (e.g., ground). Similarly, the ability to reliably write information to the SRAM cell may rely upon the ability of one of the bitlines (e.g., via driving circuitry thereof) to pull one of nodes 138 and 140 to the negative supply voltage by overpowering one of PMOS transistors 132 and 136, depending upon the state to be written. In typical scenarios, access transistors 142 and 144 are sized smaller than NMOS transistors 130 and 134, so as to ensure that the access transistors do not overpower the NMOS transistors during a read operation and corrupt the stored information. Similarly, the access transistors may be sized larger than PMOS transistors 132 and 136 so as to ensure that the PMOS transistors, and thus the cross-coupled inverters, are able to be overpowered during a write operation.

However, as mentioned above, variations in fabrication and/or in operating conditions (e.g., temperature), may result in significant variation in the performance of individual transistors. Accordingly, SRAM cell 106 may be sized according a worst-case scenario, for example, by increasing the relative sizing of the various transistors. Such a configuration may provide the desired read/write reliability at the expense of size and/or performance (e.g., due to increased time to vary charge at the various nodes).

It may therefore be desirable to selectively provide voltage assist to SRAM cell(s) 106 of memory device 100 on an as-needed basis, thereby potentially enabling smaller cell sizing and/or decreased power consumption without sacrificing read/write reliability. As illustrated, a typical SRAM cell is supplied with five "signals," namely two bitline signals 102, one wordline signal 144, a positive supply 148, and a negative supply 150 (e.g., ground). Accordingly, adjustment of any one or more of these signals may aid performance.

Figure 2A:
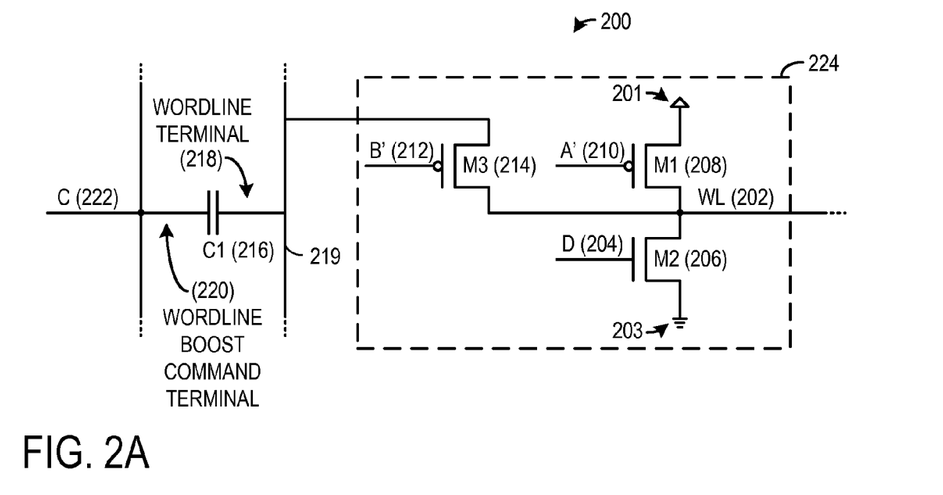
FIG. 2A schematically shows an example of voltage boost circuitry for providing a boosted voltage on SRAM wordlines.

With this in mind, FIG. 2A schematically shows voltage boost circuitry 200 for providing a boosted voltage on one or more wordlines 202 (e.g., wordline 104) according to an embodiment of the present disclosure. As described above with reference to typical SRAM cell 106, the ability to write data to an SRAM cell may rely upon the ability to overpower one of the PMOS transistors (e.g., transistors 132 and 136) of a cross-coupled inverter pair. Past approaches have therefore included sizing the access transistors (e.g., access transistors 142 and 144) larger than the PMOS transistors in order to ensure that each access transistor is able to overpower the appropriate PMOS transistor (i.e., by conducting a larger amount of current). Past approaches have also included boosting wordlines by connecting to a fixed higher-voltage supply.

In addition to or instead of a sizing approach, a boosted voltage can be applied to the access transistors. The current conducted by a NMOS FET transistor (e.g., access transistors 142 and 144) increases with the voltage differential between the gate terminal (e.g., via wordline 104 or 202) and the source terminal (e.g., via bitline(s) 102). The illustrated voltage boost circuitry 200 of FIG. 2A is configured to increase a voltage level of the signal applied to wordline 202 above the level of the positive supply to improve performance of the SRAM cells being accessed.

Figure 2B:
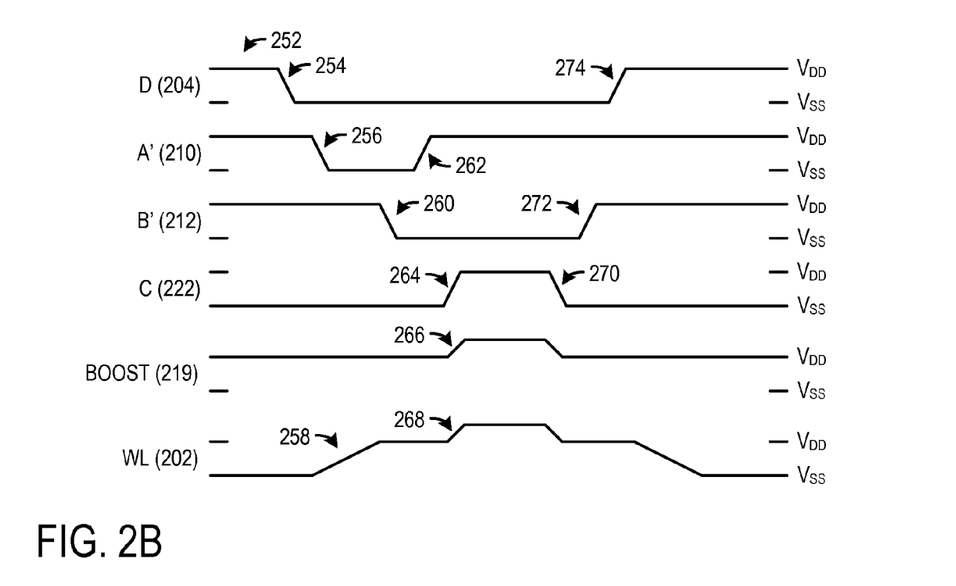
FIG. 2B shows example waveforms occurring during operation of the voltage boost circuitry of FIG. 2A.

Referring to FIG. 2A and the associated waveforms of FIG. 2B, an example boost operation will now be described. When a particular wordline 202 is not being accessed, the wordline is deasserted (e.g., by driving the wordline to the negative supply voltage) in order to disable the coupled access transistors (e.g., access transistors 142 and 144). As illustrated at 252 of FIG. 2B, active-high signal D (204) applied to transistor 206 is asserted, which enables transistor 206 and pulls/holds wordline 202 to the negative supply 203. Next, as illustrated at 254, signal D is deasserted to disconnect wordline 202 from the negative supply.

Active-low signal A' (210) is then, at 256, applied to transistor 208 to enable PMOS transistor 208. As illustrated at 258 of FIG. 2B, the positive supply is connected and the voltage on wordline 202 begins to rise as the current being conducted though transistor 208 charges an intrinsic capacitance of wordline 202. At 260, active-low signal B' (212) is applied to transistor 214, coupling wordline 202 to wordline terminal 218 of wordline boost capacitor 216 at boost node 219. While terminal 218 of capacitor 216 is coupled to the wordline, wordline boost command terminal 220 of capacitor 216 is held at the negative supply voltage by signal C; this restores the charge across capacitor 216 to the full supply potential. Signal C, more generally referred to herein as a "boost command signal," may be distributed, for example, to each wordline driver 224 in some embodiments, whereas the boost command signal may be provided to a subset of wordline drivers 224 or an individual driver in other embodiments.

Active-low signal A' is then deasserted at 262, thus decoupling wordline 202 from both the positive supply and the negative supply. This decoupled, or "floating," state of wordline 202 allows the wordline to be boosted above positive supply voltage 201. At 264, active-high signal C (222) applied to wordline boost command terminal 220 is asserted. As this occurs, charge stored via wordline boost capacitor 216 is shared with the intrinsic capacitance of wordline 202, thereby effecting a rise in voltage on boost node 219 above the positive supply at 266, and thus a rise on the coupled wordline 202 at 268. In other words, voltage boost circuitry 200 operates to boost the voltage seen at wordline 202 above positive supply voltage 201 by coupling wordline boost capacitor 216 to the intrinsic bit line capacitance of wordline 202. Signal C triggers the boost and may therefore be referred to as a "wordline boost command signal" or, more generally, as a "boost command signal."

At this point, one or more SRAM cell(s) coupled to wordline 202 may be written with desired information by appropriately driving the bitline(s), for example, as described above with reference to typical SRAM cell 106. The boosted voltage on wordline 202 may ensure that coupled access transistor(s) (e.g., access transistors 142 and 144) are able to provide suitable current to write the desired information. Once the data is written, signal C is deasserted at 270 in order to discharge the wordline to the positive supply voltage. Next, active-low signal B' is deasserted, thereby disabling transistors 214 and decoupling wordline terminal 218 of boost capacitor 216 from wordline 202. Finally, signal D is asserted at 274, so as to activate transistor 206 and lower wordline 202.

By using the intrinsic capacitance of each wordline 202, the illustrated voltage boost circuitry 200 can use less space than the auxiliary supplies often used to provide voltage assist in prior approaches and that typically employ relatively large components. Although boost capacitor 216 may be large in some embodiments, its output boost node 219 may be distributed to a plurality of wordline drivers 224 that are each coupled to an individual wordline 202. In this way, a single boost capacitor may be used across multiple rows to provide selective control over independent wordline drivers 224 (e.g., via transistors 214). By selectively and transiently generating a boosted voltage as compared to prior, constant-generation approaches, the described voltage boost circuitry may reduce power losses (e.g. due to reduced conversion, leakage, and/or distribution losses), reduced physical sizing, and/or may otherwise provide improved performance.

Voltage boost circuitry 200 and/or signal(s) may be implemented in or as part of the control logic (e.g., circuitry 110) of a particular memory device. It will be appreciated that the above-described signals are presented for the purpose of example, and that additional configurations (e.g., different activation levels, logic families, etc.) are possible without departing from the scope of the present disclosure. For example, although the waveforms of FIG. 2B are illustrated as generally swinging between negative supply level $V_{SS}$ (e.g., ground) and positive supply level $V_{DD}$, various configurations may include mechanisms for dynamically adjusting the swing of a particular signal. Such mechanisms, for example, may be desirable to ensure proper functioning of voltage boost circuitry 200 during the transient generation of voltage boost.

In particular, voltage translation/level-shifting mechanisms (e.g., single ended and/or differential cascode driver) can be used to dynamically adjust signals to maintain proper operation during boosting. During "normal" (e.g., non-boosted) operation, signals are bounded by the positive supply voltage and the negative supply voltage, but during boosting, they are level-shifted so they are bounded by the boosted voltage and the negative supply voltage. This level shifting ensures desired operation of the voltage boost circuitry across a changing voltage range. Absent level shifting, PMOS transistors 208 and/or 214 could be unintentionally enabled during generation of the boosted voltage if the respective gate-to-source voltage differential (e.g., voltage differential between the boosted voltage and the positive supply voltage) exceeds a threshold voltage of transistors 208 and/or 214, for example. As such considerations may not apply to NMOS transistors, signals provided to NMOS transistors (e.g., signal D at transistor 206) may not be level-shifted, through it will be appreciated that these scenarios are presented for the purpose of example, and are not intended to be limiting in any manner.

In addition to boosting wordlines above the positive supply, performance may be improved by boosting bitlines below a negative supply voltage. In both cases, voltages are adjusted at terminals of the cell access transistors. The ability of the access transistors (e.g., access transistors 142 and 144) to conduct current increases with an increasing gate-to-source voltage differential; thus, increased current conduction is possible by increasing the gate voltage (e.g., increasing wordline voltage) and/or decreasing the source voltage (e.g. decreasing bitline voltage).

Figure 3A:
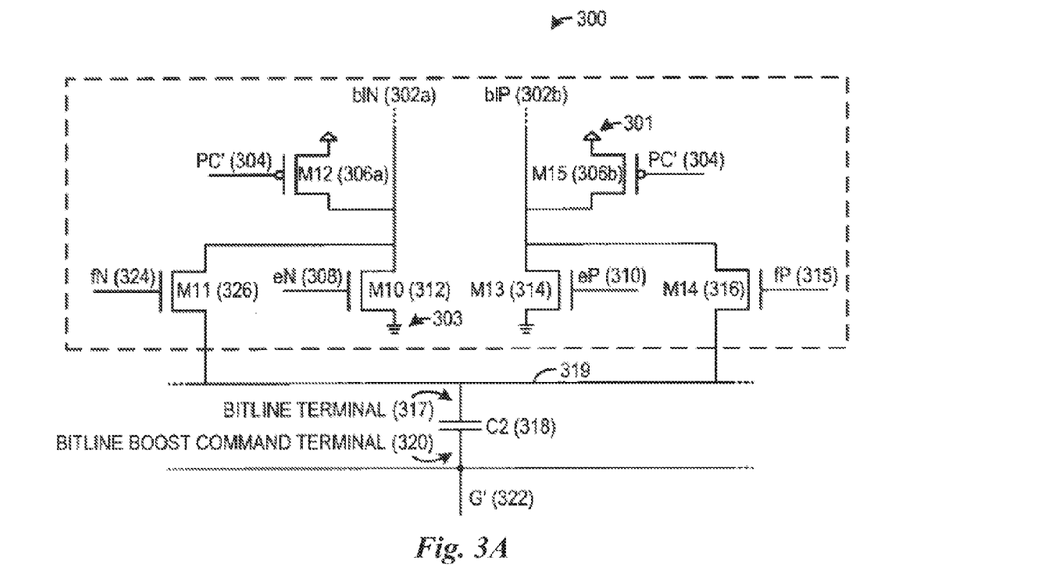
FIG. 3A schematically shows an example of voltage boost circuitry for providing a boosted voltage on SRAM bitlines.

Accordingly, turning now to FIG. 3A and the accompanying waveforms of FIG. 3B, voltage boost circuitry 300 can be used to boost bitline voltage by decreasing it to a level below that of the negative supply. As discussed with reference to FIG. 1A, bitlines 302a and 302b are precharged to positive supply voltage 301 before an SRAM cell (e.g., SRAM cell 106) is coupled to the bitlines via one or more access transistors (e.g., access transistors 142 and 144). Thus, as illustrated at 352 in the waveforms of FIG. 3B, active-low signal PC' (304) applied to precharge PMOS transistors 306a and 306b is asserted to enable the transistors and ensure that the bitlines are held to the positive supply voltage. Next, as illustrated at 354, signal PC' is deasserted to disconnect bitlines 302 from the positive supply. As with wordlines 202, it will be appreciated that each bitline 302 has an intrinsic capacitance that maintains the bitline near the positive supply voltage for a time upon disabling of precharge transistors 306.

Once the bitlines are decoupled from the positive supply, one of signals eN (308) and eP (310) is asserted in order to enable either transistor 312 or 314, respectively, depending on whether a logic 1 or logic 0 is being written to the addressed SRAM cell. For ease of understanding, description of the voltage boost circuitry will continue with reference to driving bitline 302b towards negative supply 303 by asserting active-high signal eP applied to transistor 314 at 356.

Figure 3B:
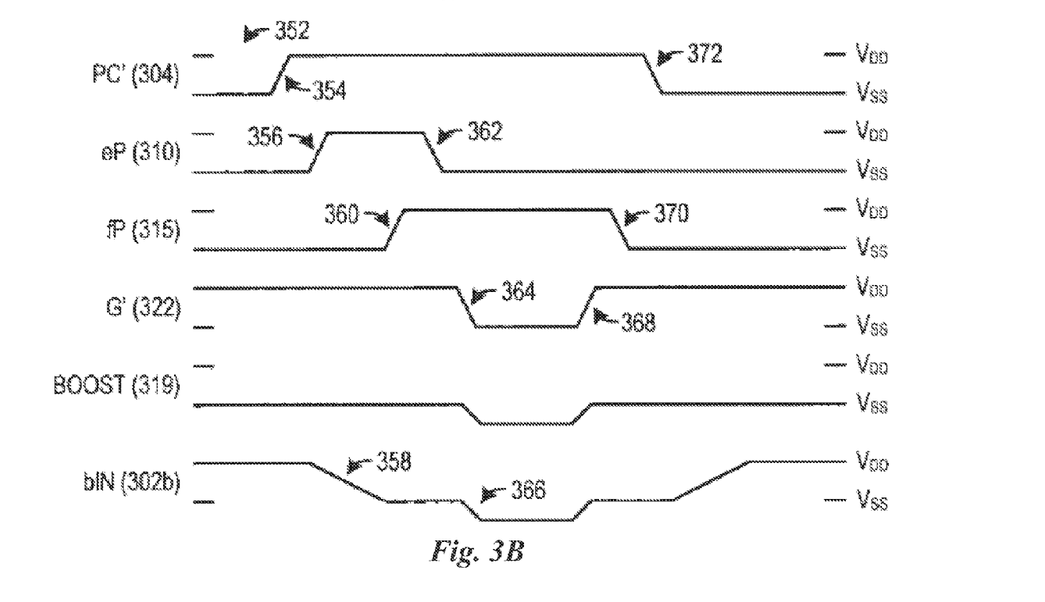
FIG. 3B shows example waveforms occurring during operation of the voltage boost circuitry of FIG. 3A.

As illustrated at 358 of FIG. 3B, the voltage on bitline 302b begins to fall as the current being conducted though transistor 314 discharges the intrinsic capacitance of bitline 302b. At 360, active-high signal fP (315) applied to transistor 316 is asserted, thereby enabling transistor 316 to couple bitline 302b to bitline terminal 317 of bitline boost capacitor 318 at boost node 319. Bitline boost command terminal 320 of capacitor 318 is held at the positive supply voltage by signal G' (322), referred to herein as a "bitline boost command signal" or, more generally, a "boost command signal." The coupling of bitline terminal 317 of capacitor 318 to the negative supply via transistors 316 and 314 while active-low signal G' remains deasserted restores the charge across capacitor 318 to the full supply potential. At 362, active-high signal eP is deasserted, thus decoupling bitline 302b and bitline terminal 317 from the negative supply and allowing for bitline 302b to be boosted below negative supply voltage 303.

At 364, active-low boost command signal G' is asserted, thereby capacitively coupling charge from bitline boost capacitor 318 to the intrinsic bitline capacitance of bitline 302b at boost node 319 so as to boost bitline 302b below the negative supply at 366. This boosted voltage on bitline 302b provides the voltage assist that may be needed to ensure that the access transistors provide sufficient current to operate as desired.

Once the cell access operation has been performed, active-low boost command signal G' is deasserted at 368, which returns the bitline to the pre-boosted negative supply voltage. Next, signal fP is deasserted at 370 in order to disable transistor 316 and disconnect the boost capacitor. Finally, precharge signal PC' is asserted at 372 to return the bitline to the level of the positive supply.

Operation of voltage boost circuitry 300 when writing an opposite state would proceed as described above with the following differences: (i) the described behavior of signal fP is instead carried out by signal fN applied to transistor 326, and (ii) the behavior of signal eP is instead carried out by signal eN applied to transistor 312. Such operation will thus boost the voltage on bitline 302a below the negative supply voltage. Signals eN, eP, fN, and fP may be provided, for example, via column decoding logic (e.g., via column decoder 116), whereas signals PC' and G' may be common across all columns in some embodiments. It will be appreciated that, as with voltage boost circuitry 200 of FIG. 2A, at least some of the signals applied to voltage boost circuitry 300 may be dynamically level-shifted/translated in order to ensure proper operation during both "normal" and "boosted" conditions.

As mentioned above, a typical SRAM cell is supplied with five "signals," each of which may be adjusted in order to improve performance of the SRAM cell. In addition to boosting wordlines above a positive supply voltage and bitlines below a negative supply voltage, it may be desirable to boost the positive supply voltage (e.g., supply voltage 148) and/or the negative supply voltages (e.g., supply voltage 150) provided to the SRAM cells. For example, a positive supply voltage may be increased in order to improve read margin, or may be decreased to improve write margin. Similarly, a negative supply voltage may be increased to improve write margin, or may be decreased to improve read margin. The circuits of FIGS. 2A and 3A may also be used to increase and decrease supply voltages.

In addition to generally providing voltage boost, the present description includes providing a specific amount of voltage boost by controlling the size of the capacitance employed in the above-described capacitive coupling. Specifically, the amount of voltage boost induced depends upon the relative sizing of the boost capacitor (e.g., boost capacitors 216 and 318) to the intrinsic capacitance of the one or more coupled SRAM line(s). As boost capacitance increases in relation to the capacitance of the coupled SRAM line(s), so too does the amount of voltage boost that may be provided. Increasing the size of the boost capacitor enables it to store more charge, and to therefore produce a larger change in the voltage on the coupled SRAM line when the boost command signal is asserted to cause the capacitive charge coupling/sharing.

Quantitatively, the amount of voltage boost $V_B$ above or below the supply depends upon the capacitance of the boost capacitor ($C_B$), the intrinsic capacitance of the one or more coupled SRAM line(s) ($C_I$), and the voltage range between the positive supply voltage and the negative supply voltage ($V_{RANGE}$) as follows:

$$V_B = V_{RANGE}\left(\frac{C_B}{C_B + C_I}\right).$$

For example, if the capacitance of a particular boost capacitor is equal to the intrinsic capacitance of the coupled SRAM line(s), the amount of available voltage boost, ignoring non-idealities, is equal to half the supply voltage range.

In addition to selecting boost capacitance at design phases, the present description includes mechanisms for dynamically selecting boost capacitance during operation of the device. Various considerations can affect the selection of the boost capacitance to dynamically provide different boost levels. For example, as operating temperatures fluctuate during use, the amount of voltage assist provided may similarly fluctuate in order to ensure proper device operation. Different levels of boost may be employed to account for the power state of the SRAM array or of circuitry and logic that make use of the SRAM array. Boost needs may fluctuate with changing device operation modes (e.g., varying positive and/or negative supply voltages, varying clock frequencies, etc.). Different portions of the SRAM array may require different levels of boost based on testing that shows different behavior (e.g., one cell needing more boost than another).

Figure 4A:
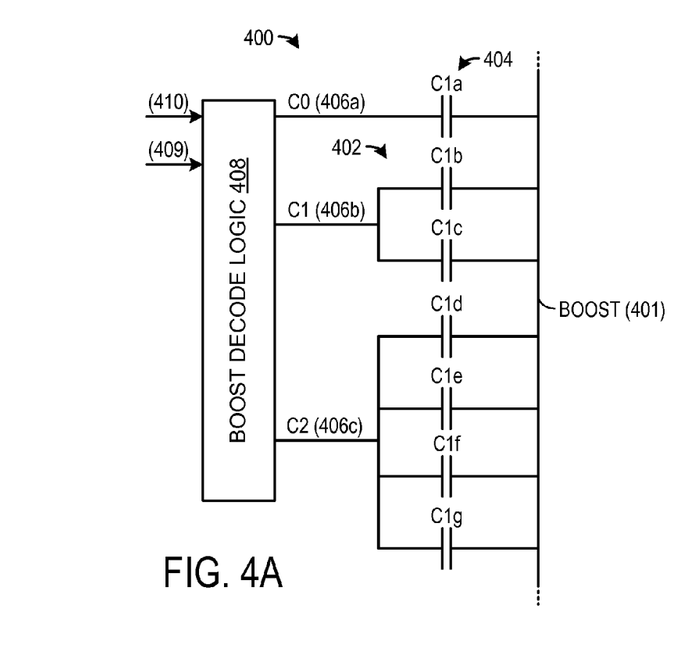
FIGS. 4A and 4B show example capacitor arrays for providing variable levels of voltage assist to SRAM lines.

Turning now to FIG. 4A, the figure shows one non-limiting example of boost capacitor array 400 for providing variable amounts of boost capacitance to boost node 401 (e.g., boost node 219 and/or 319), and thus to any one or more coupled SRAM lines (e.g., via boost circuitry 224 and/or 319). Capacitor array 400 may be substituted, for example, for boost capacitor 216 of voltage boost circuitry 200 and/or for boost capacitor 318 of voltage boost circuitry 300 in some embodiments. Essentially, the array provides an implementation in which the boost capacitance coupled to the wordlines or bitlines and its enabling signal are segmented to allow control over how much capacitance is used during capacitive charge coupling. Although capacitor array 400 typically will be larger in size than capacitors 216 and 318, the ability to dynamically vary boost levels based on address and other conditions can provide significant advantages. Furthermore, capacitor array 400 may be used for multiple SRAM lines (i.e., wordlines and/or bitlines), allowing its size to be amortized across those SRAM lines.

As illustrated, capacitor array 400 may include a plurality of capacitor groups 402, each including one or more capacitors 404 coupled to a boost command signal 406 that is segmented (lines 406a, 406b and 406c constitute signal "segments" and carry signals C0, C1 and C2 that may be asserted individually or in any combination). Signals C0, C1 and C2 are thus a segmented equivalent to boost command signal C (FIG. 2A) and boost command signal G' (FIG. 3A). In some embodiments, each capacitor C1a-C1g is equal in value. Thus when the capacitors are grouped as indicated in powers of 2, asserting C0, C1 and C2 respectively provide 1, 2 and 4 "units" of capacitance.

Boost decode logic 408 may be provided to control the enabling of a selected amount of boost capacitance. In the example, signal 409 defines the amount of boost capacitance that will be employed and is 3 bits wide corresponding to the fact that array 400 has three groups of capacitors. Each bit controls whether signals C0-C1 are asserted: e.g., when signal 409 takes on a value of {111}, this corresponds to a boost command signal that couples charge from 7 "units" of capacitance onto the relevant wordline/bitline. Accordingly, signal 409 can be used to select anywhere from 0 to 7 units of capacitance. As indicated, boost decode logic 408 may also be responsive to a global enable signal 410, which dictates whether or not any amount of boost will be employed. As discussed below, the value of signal 409 can be controlled based on the particular cell(s) being accessed and a wide variety of other considerations.

Capacitor arrays may be implemented in a wide variety of configurations other than shown in the specific example. One variation is to use more (or fewer) groups of capacitors—e.g., a 6-bit signal could be used to select between 0 and 65 units of capacitance. A single capacitor array can be used for all wordlines (or bitlines), or multiple arrays can be used, each being used for a subset of the wordlines (or bitlines), as another example. The capacitor array can be controlled with a binary select signal, as shown in FIG. 4A, or it could use a thermometer-coded control signal.

Referring still to FIG. 4A, typically one or more capacitor groups 402 will be "disabled" (e.g., not contributing to voltage assist) at any given time. However, since the disabled capacitors remain coupled to boost node 401, they nonetheless increase loading and may potentially decrease performance of capacitor array 400 (e.g., due to increase charging time on boost node 401).

Figure 4B:
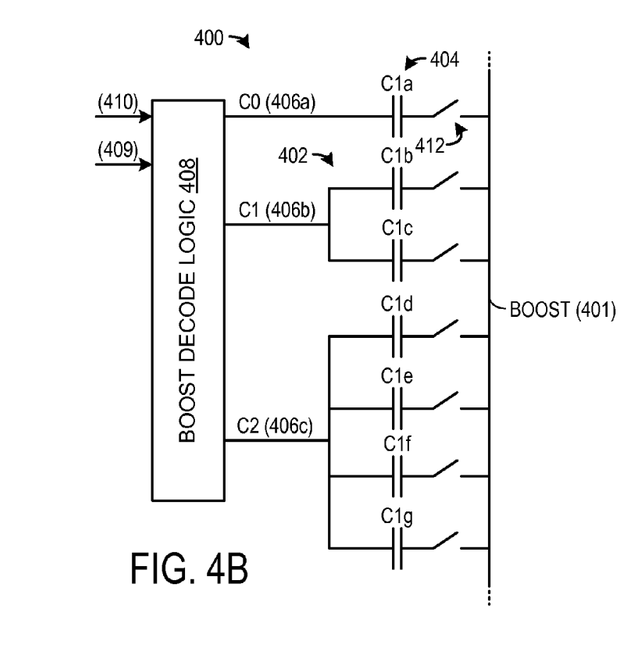

Accordingly, FIG. 4B illustrates an alternate implementation of capacitor array 400 of FIG. 4A, which includes a switching element 412 (e.g., FET transistor) coupled between each capacitor 404 and boost node 401. In other embodiments, a single switch 412 is coupled between each capacitor group 402 and boost node 401. Regardless of the specific configuration, the switches are operative to decouple selected capacitors 404 from the boost node in order to decrease capacitive loading. The decoupled capacitors are therefore not charged and discharged during the boost command cycle, which can potentially improve performance over that available with an unswitched array. Though not illustrated, the switching may be controlled by additional signals provide from boost decode logic 408.

Use of the capacitor arrays of FIGS. 4A and 4B allow voltage boost levels to vary dynamically during operation based on a wide range of factors. Boost level may be adjusted based on (1) the power state of the SRAM array or circuitry accessing the SRAM array: (2) temperature; (3) the particular operation being performed, e.g., reading versus writing; (4) measured supply voltage; and/or (5) the address of the cell being accessed. Regarding (5), any level of granularity may be employed, ranging from groups of rows and columns down to individual cells.

Address-based variations may be based on observed performance of the SRAM device, as obtained through testing or other methods. In some embodiments, the SRAM array may be configured to test operation of the SRAM cells (e.g., via Built-In Self Test "BIST" mechanisms, etc.) in order to determine an amount of voltage assist to provide. Testing may occur, for example, upon device startup, at various intervals, in response to particular operating conditions (e.g., operating temperature over a predefined threshold, change in supply voltage(s) and/or operating modes), etc. Test results may be stored in various ways (e.g., lookup tables, content-addressable memory "CAM," etc.) for future use in controlling boost levels.

Figure 5:
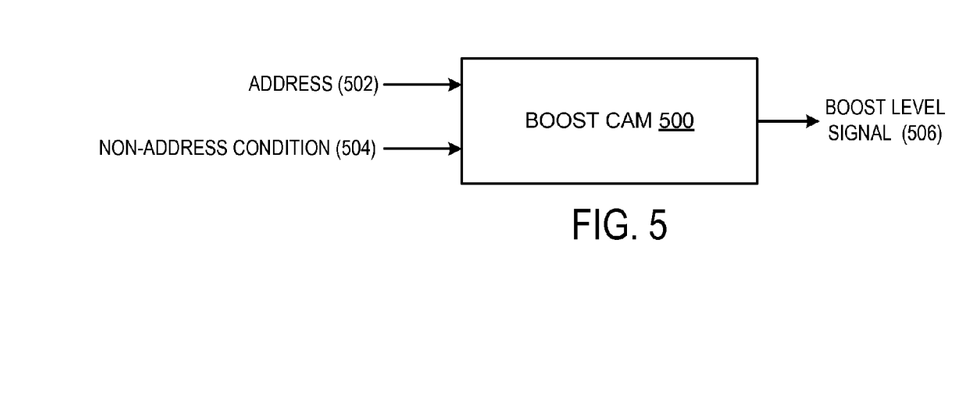
FIG. 5 schematically depicts a mechanism for providing a variable level of voltage boost based on address and other parameters/conditions.

FIG. 5 depicts a schematic example of a mechanism for generating a specific boost level dynamically in response to an address and/or other conditions, in the form of boost CAM 500. An address signal 502 and a signal 504 specifying conditions/parameters other than address are provided to the CAM as inputs. Boost CAM 500 stores boost levels and provides a lookup that correlates specific input values and combinations thereof with a boost level, which is output as a signal 506 that encodes the specific level of boost to be employed. Referring to FIGS. 4A and 4B, boost level signal 506 may be applied as the input 409 to the boost decode logic 408 in order to select a level of boost capacitance. In one implementation, boost CAM 500 outputs a default level of boost via signal 506 unless there is a match with an entry in the boost CAM, in which case a specified non-default level of boost is output via signal 506.

Address correlations in boost CAM 500 can be at any level of granularity. Boost levels may be specified for individual rows and columns, or for groups of rows and columns. In the most general case, particular boost levels can be specified for individual cells. Similar flexibility and specificity may be employed with the other conditions (power state, temperature, supply voltage, read versus write, etc.). Entries in the CAM may be populated at the design phase or during operation (e.g., via testing). The CAM may be arranged so that a more specific match overrides a less specific match. For example, one CAM entry may specify the boost to be applied to a group of four rows while a second entry specifies the boost to be applied to one row of the four. With these two entries, three of the rows will receive the boost assigned to the four-row group while the remaining row receives its individual boost.

Aspects of this disclosure have been described by example and with reference to the illustrated embodiments listed above. Components that may be substantially the same in one or more embodiments are identified coordinately and are described with minimal repetition. It will be noted, however, that elements identified coordinately may also differ to some degree. The claims appended to this description uniquely define the subject matter claimed herein. The claims are not limited to the example structures or numerical ranges set forth below, nor to implementations that address the herein-identified problems or disadvantages of the current state of the art.

The invention claimed is:

1. An SRAM array, comprising:
   SRAM lines comprising a plurality of wordlines and a plurality of bitlines;
   a plurality of cells, each cell being defined by an intersection between one of the wordlines and one of the bitlines; and
   voltage boost circuitry operatively coupled with the cells, the voltage boost circuitry comprising a boost capacitor configured to provide an amount of voltage boost that is based on an address of a cell to be accessed, where the boost capacitor is coupled and decoupled to at least one SRAM line of the SRAM lines through a transistor, where the voltage boost circuitry is configured to provide voltage boost by (i) charging an SRAM line to a pre-boosted voltage while the transistor is disabled to decouple the boost capacitor from the SRAM line; and (ii) after the charging to the pre-boosted voltage, enabling the transistor to couple the boost capacitor to the SRAM line and applying a boost command signal to a boost command terminal of the boost capacitor.

2. The SRAM array of claim 1, where the voltage boost circuitry is configured, for a cell to be accessed, to provide an amount of voltage boost that is based on the wordline defining the cell.

3. The SRAM array of claim 1, where the voltage boost circuitry is configured, for a cell to be accessed, to provide an amount of voltage boost that is based on the bitline defining the cell.

4. The SRAM array of claim 1, where the voltage boost circuitry is configured to boost voltage on one or more of the SRAM lines via capacitive charge coupling.

5. The SRAM array of claim 4, where the voltage boost circuitry is configured to provide controllable variation over the level of the boosted voltage by controlling an amount of boost capacitance used in the capacitive charge coupling.

6. The SRAM array of claim 1, where the voltage boost circuitry is configured, responsive to a test indicating that a first portion of the SRAM array behaves differently from a second portion of the SRAM array, to provide different amounts of voltage boost to the first and second portions of the SRAM array.

7. The SRAM array of claim 1, where the voltage boost circuitry is configured to provide an amount of voltage boost that is based on a power state of one or more of the SRAM array and circuitry making use of the SRAM array.

8. The SRAM array of claim 1, where the voltage boost circuitry is configured to provide an amount of voltage boost that is based on measured temperature.

9. The SRAM array of claim 1, where the voltage boost circuitry is configured to provide an amount of voltage boost that is based on measured supply voltage.

10. An SRAM array, comprising:
SRAM lines comprising a plurality of wordlines and a plurality of bitlines;
a plurality of cells, each cell being defined by an intersection between one of the wordlines and one of the bitlines; and
voltage boost circuitry coupled with the cells, the voltage boost circuitry comprising a boost capacitor configured to generate, via capacitive charge coupling, a boosted voltage on one or more of the SRAM lines, where the boost capacitor is coupled and decoupled to at least one SRAM line of the SRAM lines through a transistor,
where the voltage boost circuitry is configured to generate the boosted voltage by (i) charging an SRAM line to a pre-boosted voltage while the transistor is disabled to decouple the boost capacitor from the SRAM line, and (ii) after the charging of the SRAM line, enabling the transistor to couple the boost capacitor to the SRAM line and applying a boost command signal to a boost command terminal of the boost capacitor.

11. The SRAM array of claim 10, where the voltage boost circuitry is configured to provide controllable variation over the level of boosted voltage from one SRAM line to another.

12. The SRAM array of claim 10, where the voltage boost circuitry is configured to provide controllable variation over the level of the boosted voltage by controlling an amount of boost capacitance used in the capacitive charge coupling.

13. The SRAM array of claim 10, where the boost capacitor is segmented to enable controllable variation over the amount of capacitance that is coupled to the SRAM line or lines being boosted.

14. The SRAM array of claim 10, where the voltage boost circuitry is configured, responsive to a test indicating that a first portion of the SRAM array behaves differently from a second portion of the SRAM array, to provide different amounts of voltage boost to the first and second portions of the SRAM array.

15. The SRAM array of claim 10, where the voltage boost circuitry is configured to provide an amount of voltage boost that is based on a power state of one or more of the SRAM array and circuitry making use of the SRAM array.

16. The SRAM array of claim 10, where the voltage boost circuitry is configured to provide an amount of voltage boost that is based on measured temperature.

17. The SRAM array of claim 10, where the voltage boost circuitry is configured to provide an amount of voltage boost that is based on measured supply voltage.

18. An SRAM array, comprising:
SRAM lines comprising a plurality of wordlines and a plurality of bitlines;
a plurality of cells, each cell being defined by an intersection between one of the wordlines and one of the bitlines;
voltage boost circuitry comprising a wordline boost capacitor coupled between a wordline boost command signal and a transistor, where the wordline boost capacitor is coupled and decoupled to at least one wordline of the wordlines through the transistor, the voltage boost circuitry being configured to generate a boosted voltage on one or more of the wordlines by (i) charging the wordline to a pre-boosted voltage, while the transistor is disabled to decouple the wordline boost capacitor from the at least one wordline; and (ii) after the charging of the wordline boost capacitor, enabling the transistor to couple the wordline boost capacitor to the at least one wordline and asserting the wordline boost command signal to generate the boosted voltage; and
a bitline boost capacitor having a bitline boost command terminal and a bitline terminal, the voltage boost circuitry being configured to generate a boosted voltage on one or more of the bitlines by (i) charging the bitline boost capacitor to a pre-boosted voltage at the bitline terminal, and (ii) while one or more of the bitlines is connected to the bitline terminal, and after the charging of the bitline boost capacitor, applying a bitline boost command signal to the bitline boost command terminal,
where the wordline boost capacitor, bitline boost capacitor, wordline boost command signal and bitline boost command signal are segmented to enable controllable variation over the level of wordline and bitline voltage boost.

* * * * *